US00RE47506E

(19) United States
(12) Reissued Patent
Park

(10) Patent Number: US RE47,506 E
(45) Date of Reissued Patent: Jul. 9, 2019

(54) VARIABLE RESISTANCE MEMORY DEVICE

(71) Applicant: SK hynix Inc., Gyeonggi-do (KR)

(72) Inventor: Nam Kyun Park, Gyeonggi-do (KR)

(73) Assignee: SK hynix Inc., Gyeonggi-do (KR)

(21) Appl. No.: 15/008,245

(22) Filed: Jan. 27, 2016

Related U.S. Patent Documents

Reissue of:
(64) Patent No.: 8,829,590
Issued: Sep. 9, 2014
Appl. No.: 13/800,372
Filed: Mar. 13, 2013

(30) Foreign Application Priority Data

Oct. 30, 2012 (KR) ..... 10-2012-0121125

(51) Int. Cl.
*H01L 27/24* (2006.01)
*H01L 45/00* (2006.01)
*H01L 27/22* (2006.01)

(52) U.S. Cl.
CPC ..... *H01L 45/1206* (2013.01); *H01L 27/226* (2013.01); *H01L 27/2454* (2013.01); *H01L 27/2481* (2013.01); *H01L 45/04* (2013.01); *H01L 45/06* (2013.01); *H01L 45/1233* (2013.01); *H01L 45/147* (2013.01)

(58) Field of Classification Search
None
See application file for complete search history.

(56) References Cited

U.S. PATENT DOCUMENTS 6,961,258 B2 * 11/2005 Lowrey ..... H01L 45/06 257/E27.004
7,838,341 B2 * 11/2010 Dennison ..... 438/128
8,173,987 B2 * 5/2012 Lung ..... G11C 13/0004 257/2
2002/0018355 A1 * 2/2002 Johnson ..... G11C 11/5692 365/103
2004/0114413 A1 * 6/2004 Parkinson et al. ..... 365/100
2007/0034849 A1 * 2/2007 Sandoval ..... H01L 45/06 257/2
2007/0278578 A1 * 12/2007 Yoshida ..... H01L 21/845 257/347
2007/0279974 A1 * 12/2007 Dennison et al. ..... 365/163
2008/0224120 A1 * 9/2008 Czubatyj ..... H01L 27/2472 257/5
2009/0230505 A1 9/2009 Dennison
(Continued)

FOREIGN PATENT DOCUMENTS

CN 1714406 12/2005
CN 101933135 12/2010
(Continued)

*Primary Examiner* — Sean E Vincent

(74) *Attorney, Agent, or Firm* — IP & T Group LLP

(57) ABSTRACT

A variable resistance memory device includes a plurality of column selection switches, a plurality of variable resistance memory cells configured to be stacked and selected by the plurality of column selection switches, and a bit line connected to the plurality of variable resistance memory cells. Each of the plurality of variable resistance memory cells includes an ovonic threshold switch (OTS) element selectively driven by a plurality of word lines arranged to be stacked and a variable resistor connected in parallel to the OTS element.

16 Claims, 7 Drawing Sheets

(56) References Cited

U.S. PATENT DOCUMENTS

| | | | | |
|---|---|---|---|---|
| 2009/0303781 | A1* | 12/2009 | Lowrey | G11C 5/02 365/163 |
| 2009/0310402 | A1 | 12/2009 | Parkinson | |
| 2010/0221896 | A1 | 9/2010 | Sandoval | |
| 2010/0226165 | A1* | 9/2010 | Kang | G11C 5/02 365/148 |
| 2011/0261607 | A1* | 10/2011 | Tang | G11C 13/0007 365/148 |
| 2011/0299328 | A1* | 12/2011 | Liu | 365/163 |
| 2012/0025164 | A1 | 2/2012 | Deweerd et al. | |
| 2013/0016555 | A1* | 1/2013 | Kim et al. | 365/163 |
| 2014/0061574 | A1* | 3/2014 | Pio | H01L 27/10 257/5 |

FOREIGN PATENT DOCUMENTS

| | | | | |
|---|---|---|---|---|
| EP | 2246883 | A1 * | 11/2010 | H01L 21/8242 |
| KR | 1020100080466 | | 7/2010 | |

* cited by examiner

VARIABLE RESISTANCE MEMORY DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCES TO RELATED APPLICATION

This application claims priority under 35 U.S.C, 119(a) to Korean application number 10-2012-0121125, filed on Oct. 30. 2012, in the Korean Patent Office, which is incorporated by reference in its entirety.

BACKGROUND

1. Technical Field

The inventive concept relates to a variable resistance memory device, and, more particularly, to a 3-dimensional (3D) stack type variable resistance memory device, 2. Related Art With the rapid development of mobile and digital information communication and consumer-electronic industry, studies on existing electronic charge controlled devices are expected to encounter a limitation. Thus, new functional memory devices of the new concept other than the existing electronic charge devices need to be developed. In particular, next-generation memory devices with large capacity, ultra-high speed, and ultra-low power need to be developed.

Currently, resistive memory devices using a resistance element as a memory medium have been suggested as the next-generation memory devices. Typical resistive memory devices include phase-change random access memories (PCRAMs), resistance RAMs (ReRAMs), and magentoresistive RAMs (MRAMs), The resistive memory devices may be basically configured of a switching element and a resistance element. Also, the resistive memory devices may store data "0" or "1" according to a state of the resistance element.

Even in the resistive memory devices, the first priority is to improve an integration density and to integrate as many memory cells in a narrow area as possible. Further, in the resistive memory devices, when the plurality of memory cells is integrated in a limited area, switching performance has to be ensured.

SUMMARY

According to one aspect of an exemplary embodiment of the present invention, there is provided a variable resistance memory device. The variable resistance memory device may include a semiconductor substrate, a column selection switch formed on the semiconductor substrate, a stacked gate formed on the column selection switch, wherein the stacked gate includes a plurality of conductive layers that is stacked to be insulated from one another, an ovonic threshold switch (OTS) material layer formed on the stacked gate and connected to the column selection switch, and a variable resistance material layer formed on a surface of the OTS material layer.

According to another aspect of an exemplary embodiment of the present invention, there is provided a variable resistance memory device. The variable resistance memory device may include a semiconductor substrate, and a plurality of memory cells stacked on the semiconductor substrate and connected to one another in series, Each of the plurality of the memory cells includes an ovonic threshold switch (OTS) and a variable resistance layer, According to still another aspect of an exemplary embodiment of the present invention, there is provided a variable resistance memory device. The variable resistance memory device may include a plurality of column selection switches, a plurality of variable resistance memory cells configured to be stacked, and to be selected by the plurality of column selection switches, and a bit line connected to the plurality of variable resistance memory cells. Each of the plurality of variable resistance memory cells includes an ovonic threshold switch (OTS) element selectively driven by a plurality of word lines that is stacked and a variable resistor connected in parallel to the OTS element.

These and other features, aspects, and embodiments are described below in the section entitled "DETAILED DESCRIPTION."

BRIEF DESCRIPTION OF THE DRAWINGS

The above and other aspects, features and advantages of the subject matter of the present disclosure will be more clearly understood from the following detailed description taken in conjunction with the accompanying drawings in which.

DETAILED DESCRIPTION

Figure 1:
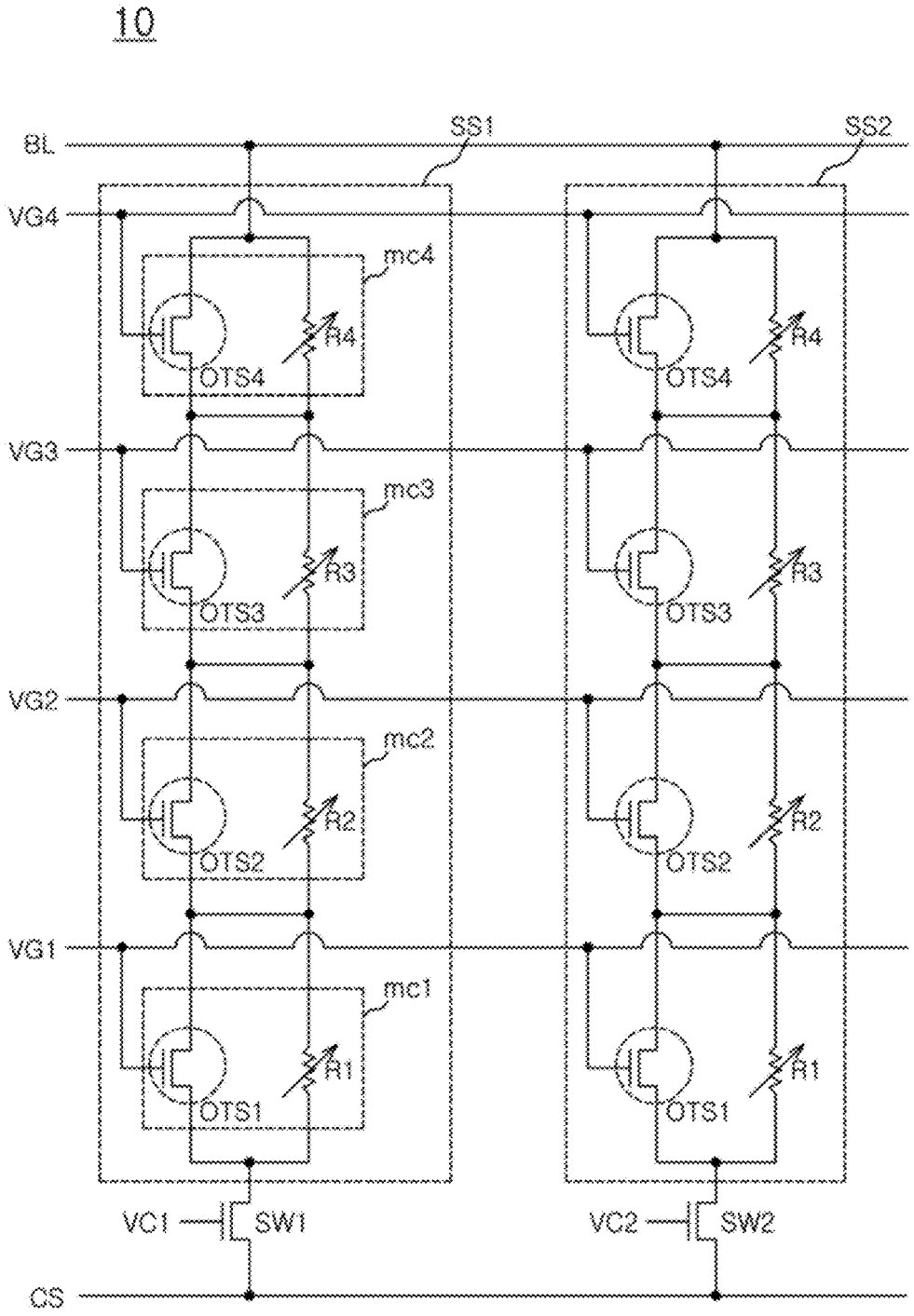
FIG. 1 is a circuit diagram illustrating a variable resistance memory device according to an exemplary embodiment of the inventive concept.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As a result, variations of the shapes of the illustrations, such as the manufacturing techniques and/or tolerances, are to be expected. Thus, exemplary embodiments should not be construed as limited to the particular shapes of regions illustrated herein but should be understood to include deviations in shapes that result from manufacturing. Thus, in the drawings, lengths and sizes of layers and regions may be exaggerated for clarity. Throughout the disclosure, reference numerals correspond directly to the like numbered parts in the various figures and embodiments of the present invention. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

Referring to FIG. 1, a variable resistance memory device 10 includes a plurality of memory cells mc1, mc2, mc3, and mc4 connected in series.

The plurality of memory cell's mc1 to mc4 may be connected in series between a bit line BL and a common source line CS. In other words, the plurality of memory cells mc1 to mc4 connected in series may be sequentially stacked on a semiconductor substrate (not shown). In the exemplary embodiment, the plurality of memory cells mc1 to mc4, which are stacked to be connected in series, is referred to and will be described as column strings SS1 and SS2.

Each of memory cells mc1 to mc4 may include each of switching elements OTS1 to OTS 4 and each of variable resistors R1 to R4. The switching element and the variable resistor constituting each memory cell may be connected parallel to each other. In the exemplary embodiment, an ovonic threshold switch (OTS) element may be used as the switching elements OTS1 to OTS 4. The OTS element for the switching elements OTS1 to OTS 4 is an element of which a threshold voltage varies based on current or voltage. This OTS element is disclosed in U.S. Pat. No. 5,694,146 in detail.

A channel layer (hereinafter, referred to as an OTS material layer) applied to the exemplary embodiment may include a chalcogenide material containing at least one selected from the group that includes tellurium (Te), selenium (Se), silicon (Si), arsenic (As), titanium (Ti) sulfur (S), and antimony (Sb). The chalcogenide material used for the OTS material layer may have superior conductivity and current mobility to a variable resistance material used for the variable resistors R1 to R4.

Figure 2:
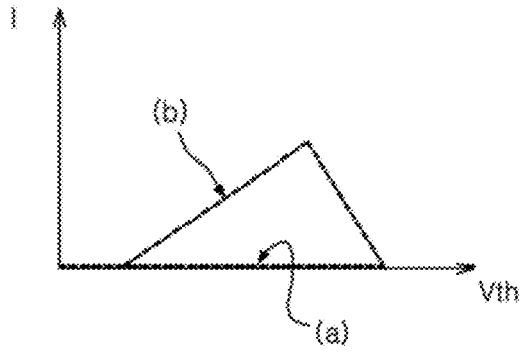
FIG. 2 is a graph illustrating current-voltage characteristic of an ovonic threshold switch (OTS) applied to an exemplary embodiment of the inventive concept.

As shown in FIG. 2, the OTS element has the characteristic that a current I is not generated in a period (a) when a gate voltage of the OTS element is not supplied, and the current I is increased in a period (b) when a constant gate voltage is supplied. Therefore, in the exemplary embodiment, the read/write from/in the variable resistor may be performed using the current generated by the gate voltage of the OTS element.

Switches SW1 and SW2 are column selection switches configured to select the column strings SS1 and SS2, respectively. Thus, the switches SW1 and SW2 are also referred to as, for example, column selection transistors SW1 and SW2.

Hereinafter, an operation of a variable resistance memory device according to an exemplary embodiment will be described.

In the exemplary embodiment, an example of data reading/writing from/in the second memory cell mc2 of the first column string SS1 of FIG. 1 will be described.

Figure 3:
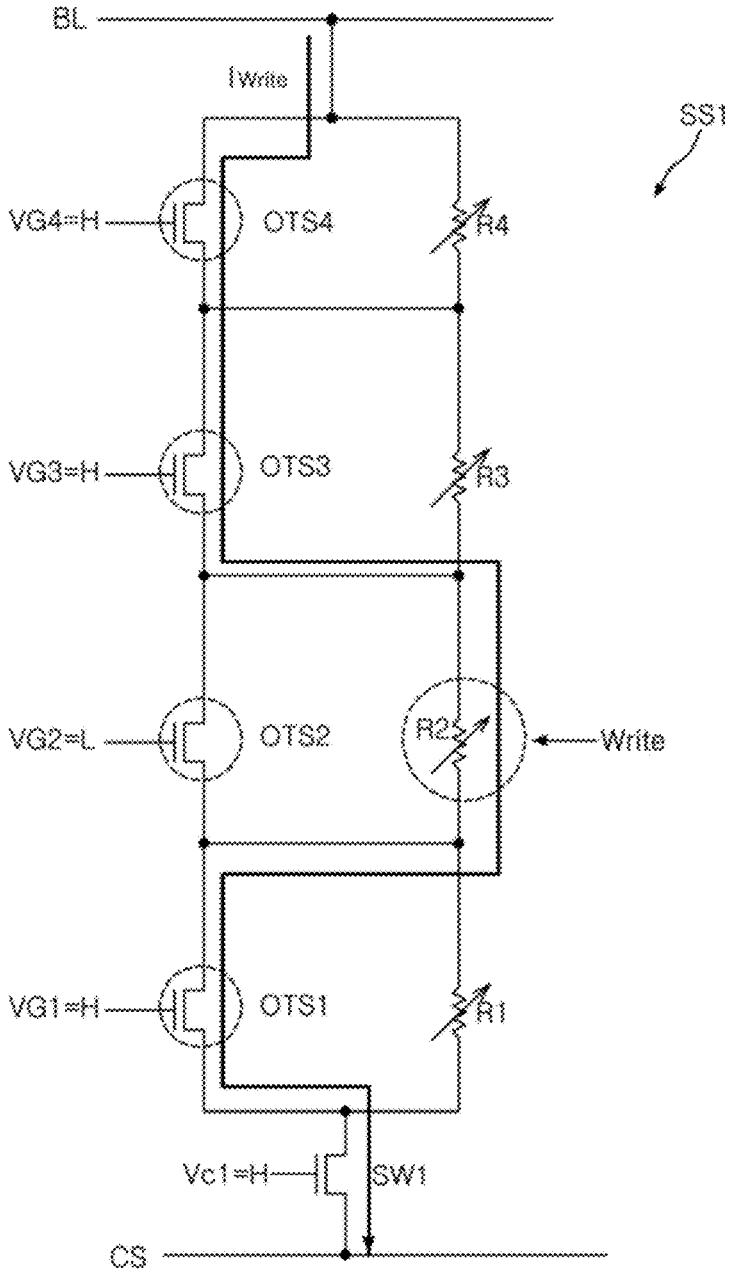
FIGS. 3 and 4 are views illustrating an operation of a variable resistance memory device according to an exemplary embodiment of the inventive concept.

Referring to FIG. 3, a high voltage, as a gate voltage VC1 is supplied to the first column selection transistor SW1 that is configured to select the first column string SS1.

Subsequently, the OTS elements OTS1, OTS3, and OTS4 of the first, third, and fourth memory cells mc1, mc3, and mc4, other than the second memory cell mc2 from which data is to be read, are enabled. In other words, high voltages, as first, third, and fourth gate voltages VG1, VG3, and VG4, are supplied to enable the first, third, and fourth OTS elements OTS1, OTS3, and OTS4, and a low voltage, as a second gate voltage VG2, is supplied to disable the second OTS element OTS2. The high voltage may correspond to a voltage in a range in which a current may be generated in the OTS element, and the low voltage may mean a state in which a voltage is not supplied.

As a result, the fourth, third, and first OTS elements OTS4, OTS3, and OTS1 of the fourth, third, and first memory cells mc4, mc3, and mc1 are turned on to form current paths. The second OTS element OTS2 of the second memory cell mc2 is disabled, so a current path is formed through the second variable resistor R2.

Therefore, a write current Iwrite provided from the bit line BL flows to the common source line CS through the fourth and third OTS elements OTS4 and OTS3, the second variable resistor R2, and the first OTS element OTS1, and thus the data is written in the second variable resistor R2.

Figure 4:
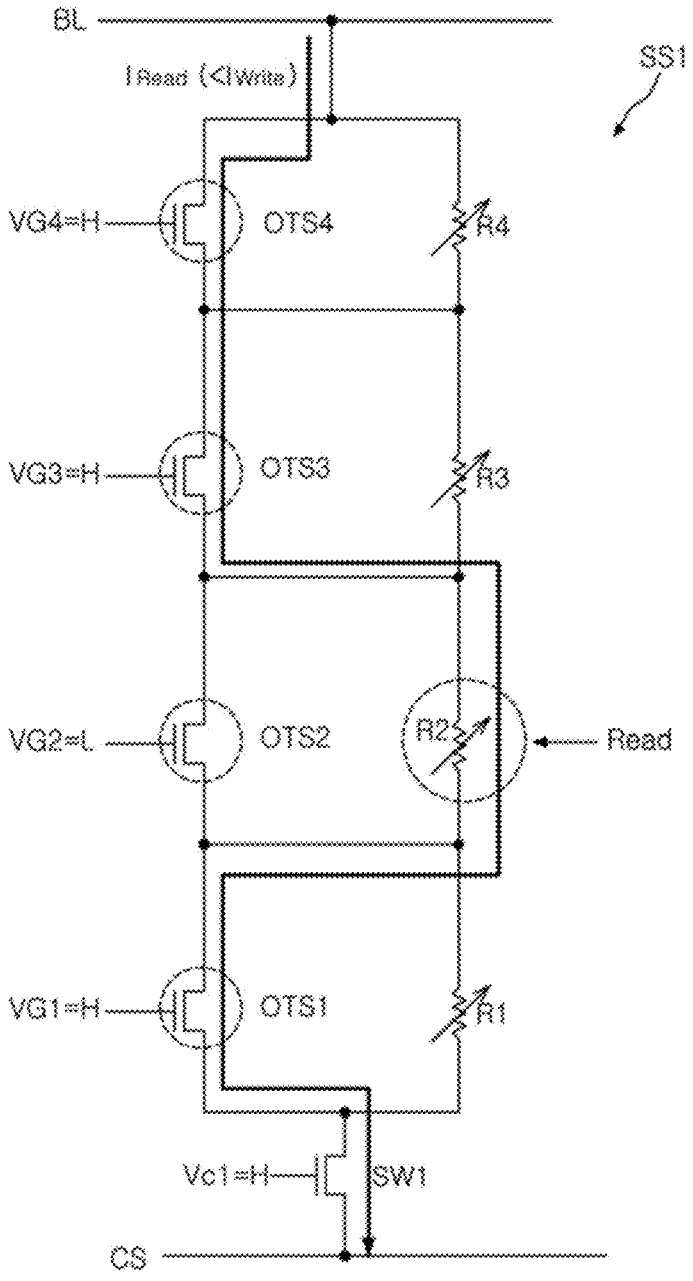

Referring FIG. 4, in the same switching on/off state as in the write operation described above, a read current Iread is provided from the bit line BL to the selected column string SS1. The read current Tread reaches the common source line CS connected to a ground terminal through the corresponding current path. The data that is written in the second variable resistor R2 may be varied based on measurement of the value of the current reaching the common source line CS. The read current Tread may have a level that may not affect a crystalline state of a variable resistor R2. In other words, the read current Iread may have a lower value than that of a write current Iwrite.

FIGS. 5 to 9 are cross-sectional views illustrating a method for manufacturing a variable resistance memory device according to an exemplary embodiment of the inventive concept.

Figure 5:
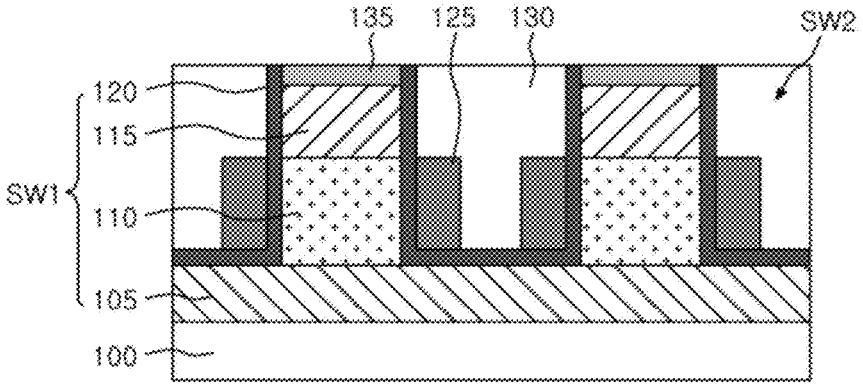
FIGS. 5 to 9 are cross-sectional views illustrating a method for manufacturing a variable resistance memory device according to an exemplary embodiment of the inventive concept.

Referring to FIG. 5, a common source region 105 is formed on a semiconductor substrate 100. The common source region 105 may include, for example, an impurity region or a conductive layer.

A conductive layer having a constant thickness is formed on the common source region 105 and then patterned to form a channel pillar 110. An impurity is implanted into an upper portion of the channel pillar 110 to form a drain region 115. Thus, a channel formation region is defined in the channel pillar 110.

The channel pillar 110 may be formed in each of regions defined as the column strings 551 and SS2. A gate insulating layer 120 is deposited on the semiconductor substrate 100 on which the channel pillar 110 is formed. A gate 125 is formed to surround the channel pillar 110. The gate 125 may be formed to have a height for a thickness) corresponding to the channel formation region. Therefore, each of the vertical column selection transistors SW1 and SW2 is formed.

An interlayer insulating layer 130 is formed on the semiconductor substrate 100 in which the column selection transistors SW1 and SW2 are formed. The interlayer insulating layer 130 may be formed to have a thickness so that the column selection transistors SW1 and SW2 are buried therein. Then, the interlayer insulating layer 130 is planarized to expose the drain region 115. Subsequently, an ohmic layer 135 may be formed in the exposed drain region 115 through a conventional method. In the exemplary embodiment, for example, a silicide layer may be used as the ohmic layer 135.

Figure 6:
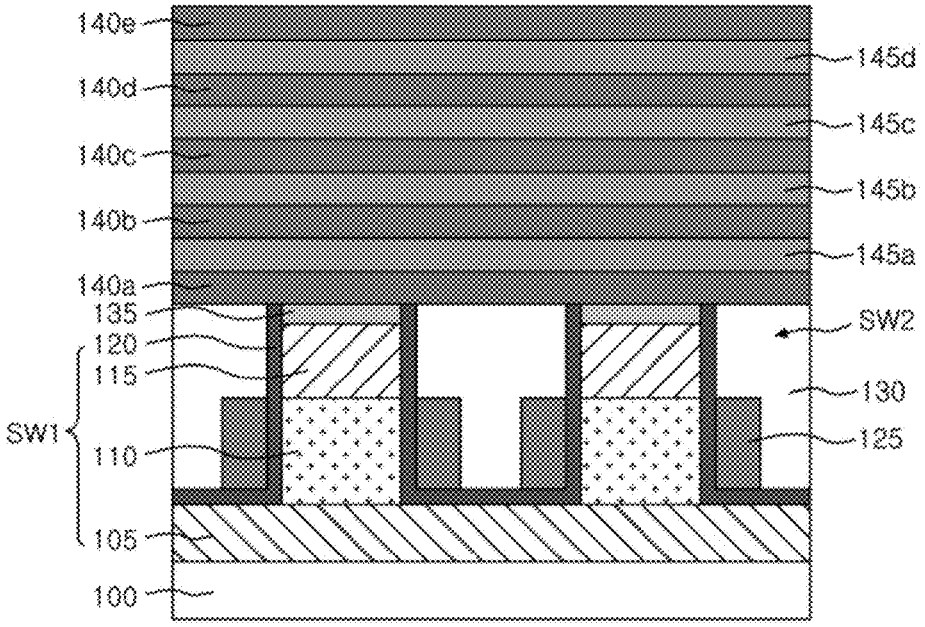

Referring to FIG. 6, a stacked gate pattern is formed by alternately depositing an insulating layer 140a, 140b, 140c, and 140d and a conductive layer 145a, 145b 145c, and 145d at least one or more times on the interlayer insulating layer 130. In the exemplary embodiment, the stacked gate pattern may be formed so that an insulating layer 140e is disposed as the uppermost layer and the insulating layer 140a, 140b, 140c, 140d, and 140e and the conductive layer 145a 145b, 145c, and 145d are alternately stacked four times in respective order.

The conductive layers 145a, 145b, 145c, and 145d may be a gate material of an OTS transistor and may include, for example, one or more materials selected from the group that includes doped polysilicon, tungsten (W), copper (Cu), titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (WAlN), tantalum silicon nitride (TaSiN), tantalum aluminum nitride (TaAlN), titanium (Ti), tungsten (W), molybdenum (Mo), tantalum (Ta), titanium silicide (TiSi), tantalum silicide (TaSi), titanium tungsten (TiW), titanium oxynitride (TiON), titanium aluminum oxynitride (TiAlON), tungsten oxynitride (WON), and tantalum oxynitride (TaON).

Figure 7:
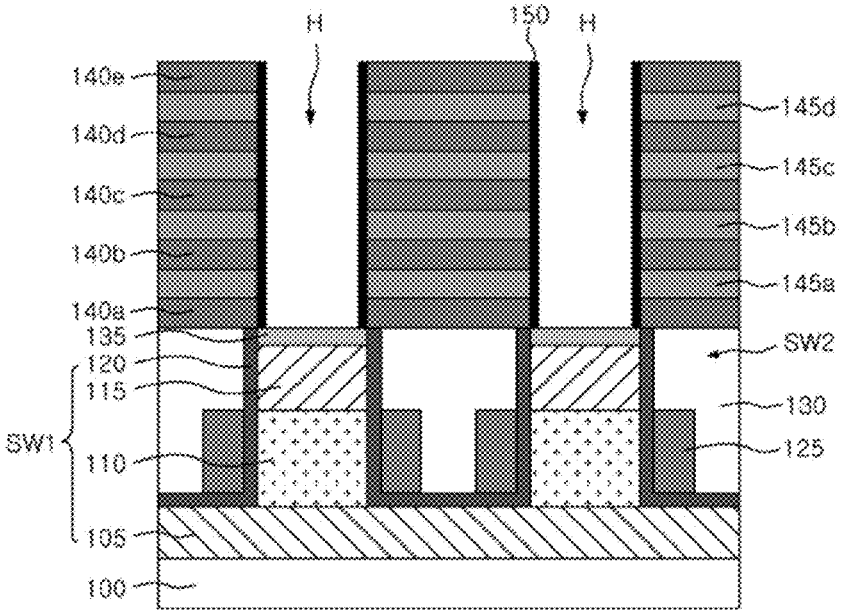

Referring to FIG. 7, the insulating layers 140a, 140b, 140c, 140d, and 140e and the conductive layers 145a, 145b, 145c, and 145d are etched to form a hole H exposing the ohmic layer 135 on each channel pillar 110. Next, a gate insulating layer 150 is deposited on a surface of the semiconductor substrate 100 including the hole H and anisotropically etched so that the gate insulating layer 150 of the OTS transistor is disposed on a sidewall portion of the hole H.

Figure 8:
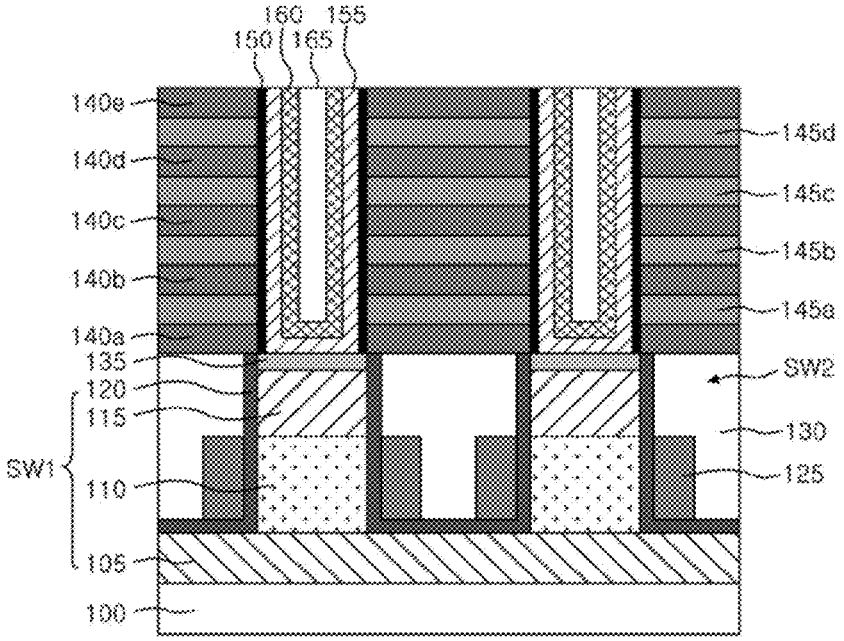

Referring to FIG. 8, an OTS material layer 155 and a variable resistance material layer 160 are sequentially deposited on the surface of the semiconductor substrate 100 including the gate insulating layer 150 formed on the sidewall portion of the hole H. The OTS material layer 155 may include at least one selected from the group of tellurium (Te), selenium (Se), germanium (Ge), silicon (Si), arsenic (As), titanium (Ti), sulfur (S) and antimony (Sb). Composition of the OTS material layer 155 may be controlled so that the OTS material layer 155 has a negative differential resistance (NDR) characteristic. The variable resistance material layer 160 may include one selected from the group that includes a PCMO layer that is a material for a ReRAM, a chalcogenide layer that is a material for a PCRAM, a magnetic layer that is a material for a MRAM, a magnetization reversal device layer that is a material for a spin-transfer torque magnetoresistive RAM (STTMRAM), and a polymer layer that is a material for a PoRAM. An adhesion improving layer (not shown) may be interposed between the OTS material layer 155 and the variable resistance material layer 160, Further, the OTS material layer 155 may be formed to be thicker than that of the variable resistance material layer 160 so that when the OTS transistor is turned on, current flow may be induced toward the OTS transistor rather than the variable resistor. Further, since the write current Iwrite varies based on a deposition thickness of the variable resistance material layer 160, low current driving is possible. In the exemplary embodiment, a resistor generated at an interface between the OTS material layer 155 and the variable resistance material layer 160 may serve as a heating electrode.

Next, a buried insulating layer 165 is formed on the semiconductor substrate 100 including the OTS material layer 155 and the variable resistance material layer 160. The buried insulating layer 165, the variable resistance material layer 160, and the OTS material layer 155 are planarized until the uppermost insulating layer 140e is exposed, and thus the buried insulating layer 165 is filled within the hole H.

Figure 9:
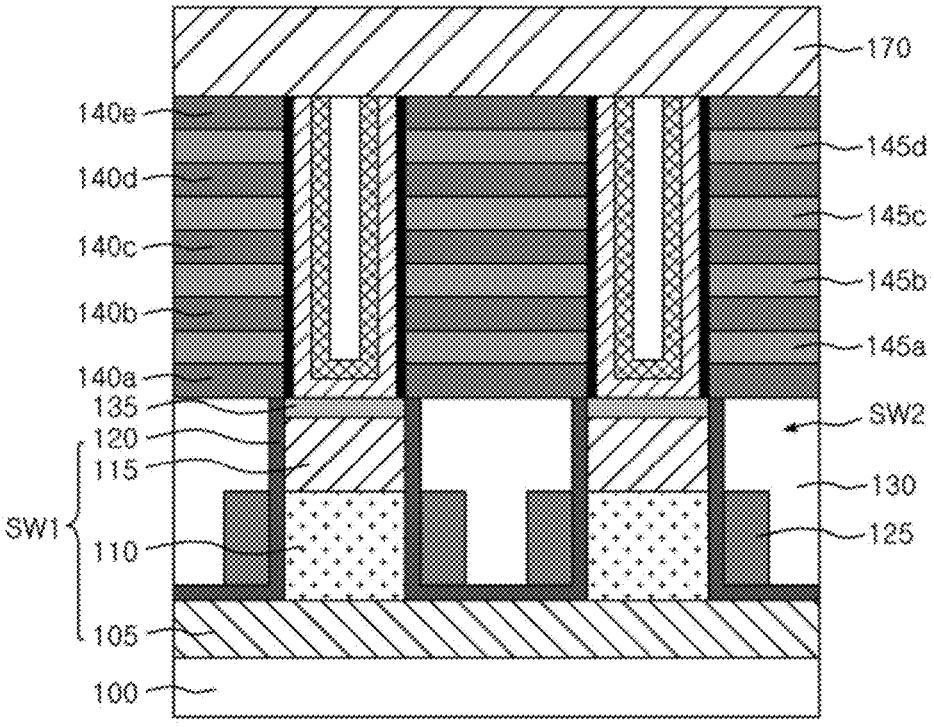

Referring to FIG. 9, a bit line 170 is formed on the resulting structure, in which the buried insulating layer 165 is buried in the hole H disposed on the semiconductor substrate 100.

According to the exemplary embodiments, cell gates are stacked and a plurality of memory cells is formed to be stacked in a confined space. Therefore, a density of integration may be improved. Further, an OTS transistor almost similar to a behavior of a variable resistance memory is used as a switching element, and thus switching characteristics may be further improved.

The inventive concept is not limited to the above-described exemplary embodiments.

Although the column selection transistor is disposed between the stacked gate and the semiconductor substrate in the exemplary embodiment, the column selection transistor may be disposed between the stacked gate and the bit line.

The above embodiments of the present invention are illustrative and not limitative. Various alternatives and equivalents are pssible. The invention is not limited by the embodiment described herein nor is the invention limited to any specific type of semiconductor device. Other additions, subtractions, or modifications are obvious in view of the present disclosure and are intended to fall within the scope of the appended claims.

What is claimed is:

1. A variable resistance memory device, comprising:

a semiconductor substrate;

*a common source line formed on the semiconductor substrate;* a column selection switch formed on the semiconductor substrate;

*an ohmic layer formed on the column selection switch;* stacked gates formed on the column selection switch, wherein the stacked gates include a plurality of conductive layers that are stacked to be insulated from one another;

an ovonic threshold switch (OTS) material layer formed on a sidewall of *a hole penetrating through* the stacked gates and connected to the column selection switch *via the ohmic layer*; [and]

a variable resistance material layer formed on a surface of the OTS material layer*;*

*a buried insulating layer filling a remaining central portion of the hole;*

*a gate insulating layer formed between the OTS material layer and the sidewall of the stacked gates, and*

*a bit line formed on top of the stack gates to be in contact with top respective surfaces of the OTS material layer, the variable resistance material layer and the buried insulating layer,*

*wherein the OTS material layer overlaps with selected stacked gates and has superior conductivity and current mobility to the variable resistance material layer, and*

*wherein a current from the bit line to the common source line flows along a portion of the OTS material layer corresponding to selected gates and a portion of the variable resistance layer corresponding to an unselected gate.*

2. The variable resistance memory device of claim 1, wherein the column selection switch includes a vertical channel transistor, wherein the vertical channel transistor includes:

a common source region formed on the semiconductor substrate;

a channel pillar formed on the common source region;

a drain formed in an upper region of the channel pillar;

a gate surrounding an outer circumference of the channel pillar; and a first gate insulating layer interposed between the channel pillar and the gate.

3. The variable resistance memory device of claim 2, wherein the stacked gates are formed to be disposed at either side of the drain.

4. The variable resistance memory device of claim 2, wherein the OTS material layer is formed on the drain of the vertical channel transistor.

5. The variable resistance memory device of claim 4, wherein the OTS material layer includes at least one selected from the group of tellurium (Te), selenium (Se), germanium (Ge), silicon (Si), arsenic (As), titanium (Ti), sulfur (S), and antimony (Sb), and wherein the OTS material layer has a negative differential resistance (NDR) characteristic.

6. The variable resistance memory device of claim 1, wherein the variable resistance material layer includes a PCMO ($Pr_{0.7}Ca_{0.3}MnO_3$) layer that is a material for a ReRAM, a chalcogenide layer that is a material for a PCRAM, a magnetic layer that is a material for a MRAM, a magnetization reversal device layer that is a material for a spin-transfer torque magnetoresistive RAM (STTMRAM), or a polymer layer that is a material for a PoRAM.

7. A variable resistance memory device, comprising:

a semiconductor substrate; and a plurality of memory cells stacked on the semiconductor substrate and connected to one another in series between a bit line and a common source line, wherein each of the plurality of memory cells includes an ovonic threshold switch (OTS) and a variable resistance layer, wherein the [OTS includes] *OTSs include* a plurality of gates stacked to be insulated from each other *and an OTS material layer formed to overlap the plurality of gates,* and the OTS is configured to be turned on based on selection of the plurality of gates,

*wherein a current from the bit line to the common source line flows along a portion of the OTS material layer corresponding to selected gates and a portion of the variable resistance layer corresponding to an unselected gate, and*

*wherein the OTS material layer overlaps with the selected gates and has superior conductivity and current mobility to the variable resistance layer.*

[8. The variable resistance memory device of claim 7, wherein the OTS and the variable resistance layer are connected in parallel to each other.]

[9. A variable resistance memory device, comprising:

a plurality of column selection switches connected to a common source line;

a plurality of variable resistance memory cells configured to be stacked, and to be selected by the plurality of column selection switches; and a bit line connected to the plurality of variable resistance memory cells, wherein each of the plurality of variable resistance memory cells includes an ovonic threshold switch (OTS) element selectively driven by a plurality of word lines that is stacked and a variable resistor connected in parallel to the OTS element.]

*10. A variable resistance memory device, comprising:*

*a plurality of gate structures stacked over insulating layers in an alternate manner;*

*a gate insulating layer formed on sidewalls of the plurality of gate structures;*

*an ovonic threshold switch (OTS) material layer formed on a surface of the gate insulating layer; and*

*a resistance layer formed on a surface of an OTS material layer,*

*wherein the OTS material layer overlaps with selected gate structures and has superior conductivity and current mobility to the resistance layer, and*

*wherein a current from the bit line to the common source line flows along a portion of the OTS material layer corresponding to selected gate structures and a portion of the variable resistance layer corresponding to an unselected gate structure.*

*11. The variable resistance memory device of claim 10,*

*wherein the OTS material layer includes at least one selected from the group of tellurium (Te), selenium (Se), germanium (Ge), silicon (Si), arsenic (As), titanium (Ti), sulfur (S), and antimony (Sb), and*

*wherein the OTS material layer has a negative differential resistance (NDR) characteristic.*

*12. The variable resistance memory device of claim 10,*

*wherein the resistance layer includes a PCMO ($Pr_{0.7}Ca_{0.3}MnO_3$) layer that is a material for a ReRAM, a chalcogenide layer that is a material for a PCRAM, a magnetic layer that is a material for a MRAM, a magnetization reversal device layer that is a material for a spin-transfer torque magnetoresistive RAM (STTMRAM), or a polymer layer that is a material for a PoRAM.*

*13. A variable resistance memory device, comprising:*

*a plurality of gate structures stacked over insulating layers in an alternate manner;*

*a gate insulating layer formed on sidewalls of the plurality of gate structures;*

*a first chalcogenide layer formed on a surface of the gate insulating layer; and*

*a second chalcogenide layer formed on a surface of the first chalcogenide layer,*

*wherein the first chalcogenide layer overlaps with selected gate structures and has superior conductivity and current mobility to the second chalcogenide layer, and*

*wherein a current from the bit line to the common source line flows along a portion of the first chalcogenide layer corresponding to selected gate structures and a portion of the second chalcogenide layer corresponding to an unselected gate structure.*

*14. The variable resistance memory device of claim 13, wherein a resistance of the first chalcogenide layer corresponding to a selected gate structure is changed by a voltage of the selected gate structure.*

*15. The variable resistance memory device of claim 14, wherein the first chalcogenide layer is an ovonic threshold switch (OTS) material layer.*

*16. The variable resistance memory device of claim 14,*

*wherein the first chalcogenide layer contains at least one selected from the group consisting of tellurium (Te), selenium (Se), germanium (Ge), silicon (Si), arsenic (As), titanium (Ti), sulfur (S), and antimony (Sb).*

*17. A method of fabricating a variable resistance memory device, the method comprising:*

*alternately forming a plurality of insulating layers and a plurality of gate layers alternately one by one on a semiconductor substrate having a conductive region, to form a stack structure comprising a plurality of gate structures connected in series;*

*etching the plurality of insulating layers and the plurality of gate layers to expose the conductive region thereby forming a hole in the stack structure;*

*forming a gate insulating layer on a sidewall of the hole;*

*forming an ovonic threshold switch (OTS) material layer on a surface of the gate insulating layer;*

*forming a resistance layer on a surface of the OTS material layer,*

*and filling a buried insulating layer in the hole in which the resistance layer is formed,*

*wherein the OTS material layer overlaps with selected gate layers and has superior conductivity and current mobility to the resistance layer.*

*18. The method of claim 17, further comprising,*

*forming a common source line on a substrate;*

*forming a column selection transistor in contact with the common source line and in contact with the OTS material layer and the resistance layer;*

*planarizing the buried insulating layer, the resistance layer and the OTS material layer to expose an uppermost insulating layer;*

*forming a bit line on the resulting structure in contact with the OTS material layer and the resistance layer,*

*wherein in operation a current flows from the bit line to the common source line along a portion of the OTS material layer corresponding to selected gate structures and a portion of the resistance layer corresponding to an unselected gate structure.*

* * * * *